(12) United States Patent
Xu et al.

(10) Patent No.: US 11,579,724 B2
(45) Date of Patent: Feb. 14, 2023

(54) TOUCH-SENSING MODULE AND DEVICE WITH THE SAME

(71) Applicant: TPK Touch Solutions (Xiamen) Inc., Fujian (CN)

(72) Inventors: Xianbin Xu, Xiamen (CN); Chunchi Lin, Yunlin County (TW); Anchin Liu, Taichung (TW); Weichou Chen, Taoyuan (TW)

(73) Assignee: TPK Touch Solutions (Xiamen) Inc., Fujian (CN)

( * ) Notice: Subject to any disclaimer, the term of this patent is extended or adjusted under 35 U.S.C. 154(b) by 138 days.

(21) Appl. No.: 17/093,266

(22) Filed: Nov. 9, 2020

(65) Prior Publication Data

US 2022/0147213 A1 May 12, 2022

(51) Int. Cl.
  *G06F 3/041* (2006.01)
  *G06F 3/044* (2006.01)
  *H05K 1/02* (2006.01)

(52) U.S. Cl.
  CPC ........ *G06F 3/04164* (2019.05); *G06F 3/0446* (2019.05); *G06F 2203/04103* (2013.01); *H05K 1/028* (2013.01)

(58) Field of Classification Search
  CPC .............. G06F 3/04164; G06F 3/0446; G06F 2203/04103; H05K 1/021
  USPC ......................................................... 345/174
  See application file for complete search history.

(56) References Cited

U.S. PATENT DOCUMENTS

| 10,698,249 | B2 | 6/2020 | Song | |
|---|---|---|---|---|
| 2008/0165158 | A1* | 7/2008 | Hotelling | G06F 3/04164 |
| | | | | 455/566 |
| 2013/0009899 | A1* | 1/2013 | Gettemy | G09G 3/3666 |
| | | | | 345/173 |
| 2014/0104509 | A1* | 4/2014 | Fang | G06F 1/169 |
| | | | | 349/12 |
| 2014/0125884 | A1 | 5/2014 | Wang | |
| 2015/0185527 | A1* | 7/2015 | Chang | H01L 51/5246 |
| | | | | 349/12 |
| 2018/0045994 | A1* | 2/2018 | Kwon | G02F 1/13439 |
| 2018/0157362 | A1* | 6/2018 | Kim | H04N 5/2257 |
| 2020/0183523 | A1* | 6/2020 | Luo | G06F 3/04164 |
| 2020/0218399 | A1* | 7/2020 | Maeng | G06F 3/04164 |
| 2021/0132721 | A1* | 5/2021 | Li | G06F 3/0412 |

FOREIGN PATENT DOCUMENTS

| CN | 110597420 A | | 12/2019 |
|---|---|---|---|
| JP | 2020056951 A | * | 4/2020 |
| KR | 20190078954 A | | 7/2019 |
| KR | 102078855 B1 | | 2/2020 |
| TW | 201418961 A | | 5/2014 |
| TW | M611582 U | | 5/2021 |

* cited by examiner

*Primary Examiner* — Mark Edwards
(74) *Attorney, Agent, or Firm* — Cooper Legal Group, LLC

(57) ABSTRACT

A touch-sensing module includes a sensing unit, an optical unit, a flexible circuit unit, and a transparent cover. The transparent cover is disposed on the optical unit. The sensing unit, the optical unit, and the transparent cover define an accommodating space. A connecting space is defined between the transparent cover and the flexible circuit unit. A fixing layer is disposed in the connecting space to connect the transparent cover and the flexible circuit unit.

18 Claims, 7 Drawing Sheets

TOUCH-SENSING MODULE AND DEVICE WITH THE SAME

BACKGROUND

Field of Disclosure

The disclosure relates to a sensing module and a display device, and more particularly to a touch-sensing module and a touch-sensing display device.

Description of Related Art

With the advantages of bright colors and low energy consumption, light-emitting diode (LED) display devices and organic light-emitting diode (OLED) display devices have been widely used in people's lives. Organic light-emitting diode display devices are also one of the main technologies applied in curved display devices and flexible display devices since the OLEDs can be bent.

Since touch sensing technology has also become one of the main input interfaces for people to operate electronic devices such as computers, mobile phones, or tablet computers, current electronic devices often need to have a touch display module. Because the flexible printed circuit (FPC) used to transmit touch signals needs to be electrically connected to the touch sensing unit in the touch display module through anisotropic conductive adhesive by hot pressing, a thickness of the anisotropic conductive adhesive and the flexible printed circuit board can cause the light-transmitting cover on the touch display module to deform and further result in no space to fill the anisotropic conductive adhesive, resulting in a decrease in the yield of the touch display module.

SUMMARY

The touch-sensing module and the touch display module of the embodiment of the present disclosure can have conductive lines with good sensing signal transmission.

According to one or more embodiments in the present disclosure, a touch-sensing module includes a sensing unit, an optical unit disposed on the sensing unit, a transparent cover disposed on the optical unit, and a flexible circuit unit. The optical unit is disposed on the sensing unit. The transparent cover is disposed on the optical unit. The transparent cover, the optical unit, and the sensing unit define an accommodating space. The flexible circuit unit is disposed in the accommodating space. A connecting space is defined between the transparent cover and the flexible circuit unit. A fixing layer is disposed in the connecting space to connect the transparent cover and the flexible circuit unit.

In one embodiment of the present disclosure, the sensing unit has a sensing surface. A normal direction of the sensing surface is parallel to a first direction. A thickness of the flexible circuit unit in the first direction ranges from 50% to 80% of a thickness of the accommodating space in the first direction.

In one embodiment of the present disclosure, the sensing unit has a sensing surface. A normal direction of the sensing surface is parallel to a first direction. A thickness of the fixing layer in the first direction ranges from 10% to 40% of a thickness of the accommodating space in the first direction.

In one embodiment of the present disclosure, the touch-sensing module further includes a visible area and a peripheral area. The sensing unit defines a connecting area in the peripheral area over which the flexible circuit unit is disposed. A filling area including glue is disposed between the flexible circuit unit and the sensing unit.

In one embodiment of the present disclosure, the optical unit includes a first transparent adhesive layer, a polarizing layer, and a second transparent adhesive layer. The first transparent adhesive layer is disposed on a sensing surface of the sensing unit in the visible area. The polarizing layer is disposed on the first transparent adhesive layer. The second transparent adhesive layer is disposed on the polarizing layer.

In one embodiment of the present disclosure, the touch-sensing module further includes a conductive connection layer. The conductive connection layer is disposed between the flexible circuit unit and the connecting area of the sensing unit. A thickness of the conductive connection layer ranges from 10% to 25% of a thickness of the accommodating space in a first direction parallel to a normal direction of a sensing surface of the sensing unit.

In one embodiment of the present disclosure, a normal direction of a sensing surface of the sensing unit is parallel to a first direction, and the flexible circuit unit has a thickness in the first direction. The thickness of the flexible circuit unit in the first direction ranges from 30 µm to 43 µm, or the thickness of the flexible circuit unit in the first direction in a range of 10 µm to 15 µm.

According to one or more embodiments in the present disclosure, a touch-sensing module includes a sensing unit, an optical unit disposed on the sensing unit, and a flexible circuit unit. The optical unit is disposed on the sensing unit. The flexible circuit unit is connected to the sensing unit. A thickness of the flexible circuit unit along a first direction is less than a thickness of the optical unit along the first direction.

In one embodiment of the present disclosure, the sensing unit has a sensing surface. A normal direction of the sensing surface is parallel to the first direction. The thickness of the flexible circuit unit in the first direction ranges from 50% to 80% of a thickness of an accommodating space defined in part by the optical unit in the first direction.

In one embodiment of the present disclosure, the sensing unit has a sensing surface. A normal direction of the sensing surface is parallel to the first direction. The thickness of the flexible circuit unit in the first direction ranges from 10% to 40% of a thickness of an accommodating space defined in part by the optical unit in the first direction.

In one embodiment of the present disclosure, the touch unit includes a visible area and a peripheral area. The sensing unit defines a connecting area in the peripheral area over which the flexible circuit unit is disposed. A filling area including glue is disposed between the flexible circuit unit and the sensing unit.

In one embodiment of the present disclosure, the optical unit includes a first transparent adhesive layer, a polarizing layer, and a second transparent adhesive layer. The first transparent adhesive layer is disposed on a sensing surface of the sensing unit in the visible area. The polarizing layer is disposed on the first transparent adhesive layer. The second transparent adhesive layer is disposed on the polarizing layer.

In one embodiment of the present disclosure, the touch-sensing module further includes a conductive connection layer. The conductive connection layer is disposed between the flexible circuit unit and the connecting area of the sensing unit. A thickness of the conductive connection layer ranges from 10% to 25% of a thickness of the accommodating space in the first direction defined in part by the optical unit.

In one embodiment of the present disclosure, a normal direction of a sensing surface of the sensing unit is parallel to the first direction. The thickness of the flexible circuit unit in the first direction ranges from 30 μm to 43 μm, or the thickness of the flexible circuit unit in the first direction in a range of 10 μm to 15 μm.

According to one or more embodiments in the present disclosure, a device or an electronic device of the present disclosure includes the touch-sensing module mentioned above.

In summary, in the embodiments of the present disclosure, a connecting space is formed between the sensing unit, the transparent cover of the touch display module, and the flexible circuit unit, and the fixing layer is located in the connecting space. Therefore, the flexible circuit unit and the sensing unit can be firmly connected without affecting the shape/position of the transparent cover.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
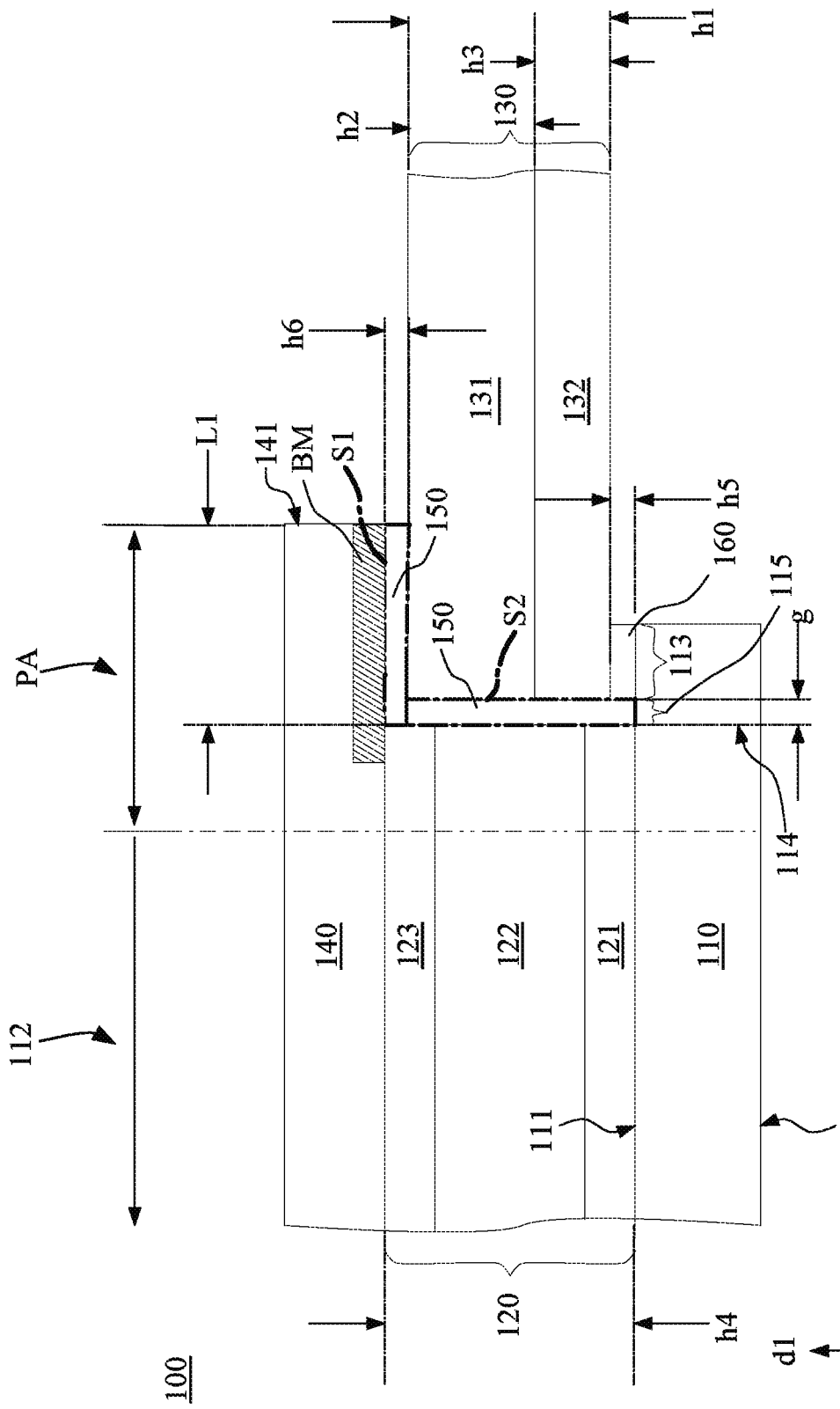
FIG. 1 is a cross-sectional view of a touch-sensing module according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

In addition, relative terms such as "lower" or "bottom" and "upper" or "top" can be used herein to describe the relationship between one element and another element, as shown in the figures. It should be understood that relative terms are intended to include different orientations of the device other than those shown in the figures. For example, if the device in one figure is turned over, elements described as being on the "lower" side of other elements will be oriented on the "upper" side of the other elements. Therefore, the exemplary term "lower" may include an orientation of "lower" and "upper", depending on the specific orientation of the drawing. Similarly, if the device in one figure is turned over, elements described as "below" other elements will be oriented "above" the other elements. Therefore, the exemplary term "below" can include an orientation of "above" and "below".

The touch-sensing module and the touch display device of the embodiment of the present disclosure can be used in a light emitting diode display device or an organic light emitting diode display device, and the present invention is not limited thereto. The touch-sensing module and the touch display module of the embodiment of the present disclosure can have an integrated stack-up with higher strength.

It shall be understood that, although the terms first, second, third, etc. may be used herein to describe various units, components, regions, layers, or sections, these units, components regions, layers, or sections are not limited by these terms. Rather, these terms are merely used to distinguish one unit, component, region, layer, or section from another region, layer, or section. Thus, a first unit, component, region, layer, or section discussed below could be termed a second unit, component, region, layer, or section without departing from the teachings of the present disclosure.

Referring to the drawings, the illustrated thickness of the layers and regions may be exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Rather, when a unit is referred to as being "directly on" or "directly connected to" another unit, there are no intervening units. As used herein, "connection" can refer to physical and/or electrical connection. Furthermore, "electrical connection" or "coupling" can mean that there are other units between two units.

In an embodiment of the present disclosure, a touch-sensing module 100 is mainly obtained by integrating the sensing unit 110 and an optical unit 120, while a flexible circuit unit 130 is electrically connected to the sensing unit 110 by means of hot pressing, etc. Through the integration of the above units, in the embodiment of the present disclosure, the thickness of the flexible circuit unit 130 (that is, the thickness along a first direction d1 described later) is less than the thickness of the optical unit 120 (that is, the thickness along the first direction d1 described later) to avoid the problem of deformation of a transparent cover 140 assembled on the touch-sensing module 100. In addition, when the thickness of the flexible circuit unit 130 is less than the thickness of the optical unit 120, a gap is formed between the flexible circuit unit 130 and the transparent cover 140 (that is, connecting space S1 described later). In one embodiment of the present disclosure, glue or the like can be filled in the connecting space S1 to form a fixing layer 150. The fixing layer 150 can make the flexible circuit unit 130, the transparent cover 140, and the touch unit (the integrated stack-up of the sensing unit 110 and the optical unit 120) to form a highly integrated product with better assembly strength. FIG. 1 is a cross-sectional view of the touch-sensing module 100 according to one embodiment of the present disclosure. Reference is made by FIG. 1. For the convenience of description, in an embodiment of the present disclosure, the touch-sensing module 100 includes the sensing unit 110, the optical unit 120, the flexible circuit unit 130, the transparent cover 140, and the fixing layer 150.

Figure 2:
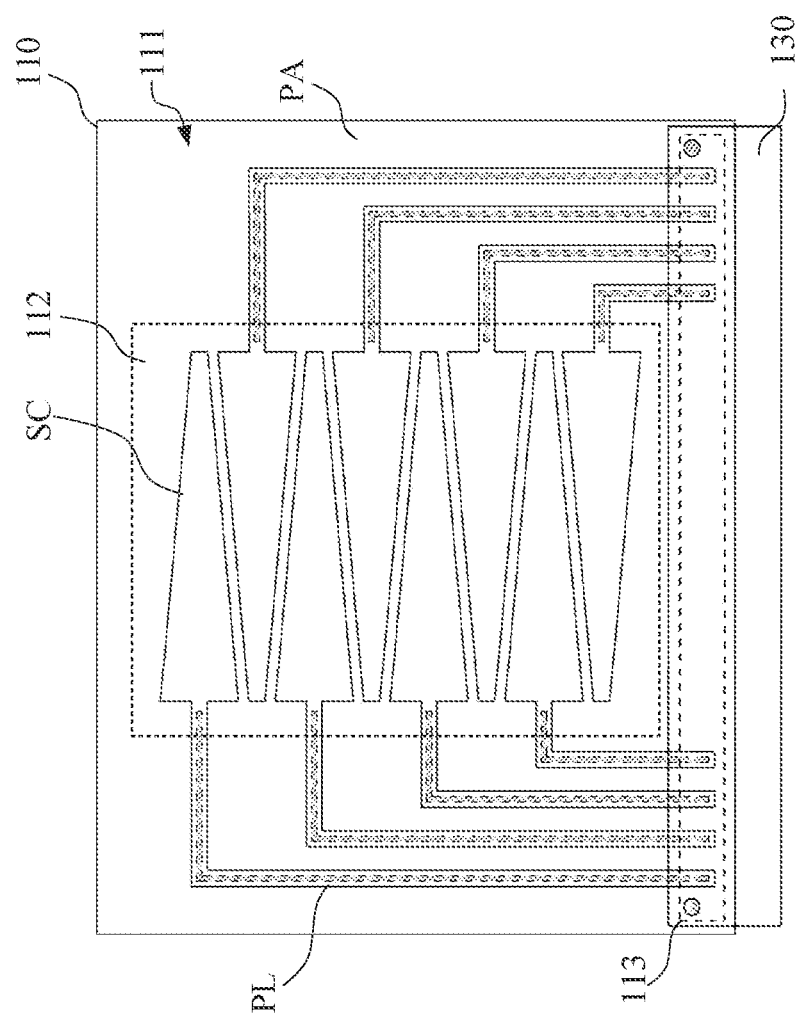
FIG. 2 is a top view of a sensing unit and a flexible circuit unit according to one embodiment of the present disclosure.

Please also refer to FIG. 2. FIG. 2 is a top view of the sensing unit 110 and the flexible circuit unit 130 according to one embodiment of the present disclosure. To simplify, the optical unit 120, the transparent cover 140, and the fixing layer 150 are not shown in FIG. 2. The sensing unit 110 has a sensing surface 111 on which a sensing electrode SC and a peripheral line PL can be formed. The sensing surface 111 generally includes a visible area 112 and a peripheral area PA. Specifically, the sensing electrode SC used to sense touch/gesture of a user is substantially located in the visible area 112, and the peripheral line PL used to transmit electrical signals such as sensing signals/control signals is substantially located in the peripheral area PA. The peripheral area PA can have at least a connecting area 113. The connecting area 113 is adjacent to an edge, for example an edge 114 of the sensing surface 111 of the sensing unit 110. One end of the peripheral line PL is electrically connected to the sensing electrode SC, and the other end extends to the connecting area 113. The end of the peripheral line PL extending to the connecting area 113 can be provided with a connecting portion (also referred to as a solder pad), which can be electrically connected with a circuit on the flexible circuit unit 130 to transmit signals. Reference is made by FIG. 1. The peripheral area PA can further have a filling area 115. Specifically, the filling area 115 can be defined between the optical unit 120 and the flexible circuit unit 130, and the filling area 115 may be used to fill the fixing layer 150 (e.g., the filling area 115 may be filled with glue or the like to form the fixing layer 150). The fixing layer 150 covers the peripheral line PL. In some embodiments, the filling area 115 may be a gap, meaning that the glue is not filled therein. In one embodiment, the peripheral area PA does not have the design of the filling area 115. That is, the front edge of the flexible circuit unit 130 would extend as far as possible toward the visible area 112 and may contact with the edge 114.

The position of the optical unit 120 substantially corresponds to the sensing unit 110. In detail, the size of the optical unit 120 is roughly the same as that of the sensing unit 110, yet the aforementioned connecting area 113 and/or filling area 115 is exposed. In this embodiment, the visible area 112 and the connecting area 113 do not overlap with each other, and the filling area 115 is mainly defined by the sidewalls of the optical unit 120, wherein the sidewalls of the optical unit 120 and the flexible circuit unit 130 correspond to each other.

Please return to FIG. 1. The transparent cover 140, the optical unit 120, and the sensing unit 110 substantially define an accommodating space for accommodating the flexible circuit unit 130. The flexible circuit unit 130 is located on the sensing unit 110. Specifically, the flexible circuit unit 130 is located on the connecting area 113 of the sensing surface 111 to achieve electrical connection with the connection portion of the peripheral line PL on the connecting area 113. In one embodiment, the filling area 115 has a distance g, so that the fixing layer 150 can fill the entire filling area 115 well without causing problems such as bubbles and glue overflow. In this embodiment, the filling area 115 is sometimes referred to as a glue-filled area 115.

The transparent cover 140 is an outermost unit, which is mainly located on the optical unit 120 and part of the flexible circuit unit 130. In one embodiment, the two sides (e.g., the lower surface and the upper surface) of the optical unit 120 are respectively connected to the sensing unit 110 and the transparent cover 140, and the strength of the flexible circuit unit 130 and the structural factors of the overall product are improved. A connecting space S1 can be formed between the transparent cover 140 and the flexible circuit unit 130. Specifically, in this embodiment, the transparent cover 140 extends beyond the sensing unit 110 in a second direction d2 to cover the visible area 112 and the peripheral area PA. As shown in FIG. 1, an edge 141 of the transparent cover 140 protrudes from the edge 114 of the optical unit 120 in the second direction d2 and has a distance L1. The protruding part of the transparent cover 140 can be used to assemble the outer frame of the end-product and can shield non-transparent units such as the flexible circuit unit 130 in order to avoid being observed by the user. Specifically, the transparent cover 140 is provided with a light-shielding layer BM to shield non-transparent components such as the flexible circuit unit 130. In some embodiments, the light-shielding layer BM includes black matrix. In one embodiment, due to the requirements of narrow-frame products, the smaller the distance L1, the more viscous the fixing layer 150 must be to effectively fix the flexible circuit unit 130 and the transparent cover 140. For small size end-products (such as mobile phones, watches, etc.), the distance L1 is recommended to be more than 0.1 mm. For medium and large size end-products (such as tablets, notebooks, digital whiteboards, TVs, etc.), the distance L1 is recommended to be 0.5 mm or above. In addition, a thickness h6 of the connecting space S1 in the first direction d1 ranges from 10% to 40% of a thickness h4 of the accommodating space in the first direction d1. By controlling the size of the connecting space S1 (i.e., the distance L1 and the thickness h6) to obtain suitable characteristics of the fixing layer 150, the flexible circuit unit 130 and other components (such as the transparent cover 140, the optical unit 120, the sensing unit 110, etc.) have better assembly strength. In one embodiment, the size of glue after curing to form the fixing layer 150 is substantially equal to the size of the connecting space S1, which includes the distance L1 and the thickness h6. In addition, as shown in FIG. 1, the first direction d1 is parallel to a thickness direction of the entire stack, and the second direction d2 is perpendicular to the thickness direction of the entire stack.

Further, a filling space S2 is formed on the filling area 115 between the transparent cover 140 and the sensing unit 110. Specifically, the filling space S2 is defined by the filling area 115 along the first direction d1. The filling space S2 is connected to the connecting space S1 in the remaining space, so materials such as glue can flow into the connecting space S1 and the filling space S2 to form a fixing layer 150 with an L-shaped cross-section. In one embodiment, the fixing layer 150 and the optical unit 120 form a coplanar plane to facilitate the assembly of the transparent cover 140.

As shown in the figure, in this embodiment, the transparent cover 140, the optical unit 120, and the sensing unit 110 substantially define an accommodating space, which has a thickness h1, and is defined by the transparent cover 140, the optical unit 120, and the sensing unit 110. The accommodating space defined by the sensing unit 110 can be used for accommodating the flexible circuit unit 130. In addition, the accommodating space may include the connecting space S1 and/or the filling space S2. After the flexible circuit unit 130 is accommodated in the accommodating space defined by the transparent cover 140, the optical unit 120, and the sensing unit 110, the glue is dispersed in the connecting space S1 and/or the filling space S2 to form the fixing layer 150. Thus, the flexible circuit unit 130, the transparent cover 140, the optical unit 120, and the sensing unit 110 are fixed to each other.

In the touch-sensing module 100 of this embodiment, the connecting space S1 is formed between the transparent cover 140 and the flexible circuit unit 130. Therefore, the fixing layer 150 can be connected to the transparent cover 140 and the flexible circuit unit 130, and the strength and stability of the touch-sensing module 100 is further increased.

Further, since the connecting space S1 is between the transparent cover 140 and the flexible circuit unit 130, the flexible circuit unit 130 does not directly touch the transparent cover 140, and the sensing unit 110, the optical unit 120, and the transparent cover 140 can be stacked parallel to each other without being affected by the flexible circuit unit 130.

In this embodiment, the sensing unit 110 includes a touch sensing circuit. For example, the touch sensing circuit of the sensing unit 110 includes sensing electrodes located on the sensing surface 111, such as transparent conductive electrodes or a patterned transparent conductive film. In some embodiments, the touch sensing circuit can be flexible. For example, the touch sensing circuit can include touch sensing electrodes formed by patterning a conductive film formed by metal nanowires or carbon nanotube electrode. In some embodiments, the touch sensing electrodes include Indium Tin Oxide (ITO), Indium Zinc Oxide (IZO), Cadmium Tin Oxide (CTO), or Aluminum-doped Zinc Oxide (AZO) made of transparent conductive film. As used herein, "metal nanowires" is a collective term that refers to a collection of metal wires containing multiple unit metals, metal alloys, or metal compounds (including metal oxides), which include metal nanowires. The number of wires does not affect the scope of protection claimed by the present invention. At least one cross-sectional size, which is the diameter of the cross-section, of a single metal nanowire is less than about 500 nm, preferably less than about 100 nm, and more preferably less than about 50 nm. The term "wire" has used herein includes metal nanostructures, and the metal nanostructure mainly have a high aspect ratio, such as between about 10 and 100,000. More specifically, the aspect ratio (length:diameter of the cross section) of the metal nanowire can be greater than about 10, preferably greater than about 50, and more preferably greater than about 100. The metal nanowire can be any metal, including (but not limited to) silver, gold, copper, nickel, and gold-plated silver. Other materials, such as silk, fiber, tube, etc., if they also have the above-mentioned dimensions and high aspect ratio, are also covered by this disclosure.

Metal nanowires layer can include a layer of silver nanowires, a layer of gold nanowires, or a layer of copper nanowires. In this embodiment, the specific manufacturing method for metal nanowires is as follows. A slurry or ink having metal nanowires is formed on a substrate by a coating method. The dispersion or ink with metal nanowires on the substrate is dried and covers the surface of the substrate to form a metal nanowire layer. After the above curing/drying step, solvent and other substances in the slurry or ink are volatilized, the metal nanowires are randomly distributed on the surface of the substrate, and the metal nanowires can contact each other to provide a continuous current path, thereby forming a conductive network. Then, the metal nanowire layer is patterned to make a sensing circuit of the sensing unit 110.

In some embodiments, a film layer can be coated with a metal nanowire to form a composite structure that has certain specific chemical, mechanical, and optical properties. For example, the film layer can provided adhesion between the metal nanowire and the sensing unit 110. The film layer has better physical mechanical strength than the metal nanowire, and the film layer can also be called a matrix. In some embodiments, some specific polymers are used to make the film layer, so that the metal nanowire has additional surface protection against scratches and abrasion. The specific polymer may include polyacrylate, epoxy resin, polyurethane, polysiloxane, polysiloxane, poly(silicon-acrylic acid), etc. In this case, the film layer can be called a hard coat or overcoat, and the film layer can make metal nanowires have higher surface strength to improve scratch resistance. Furthermore, ultraviolet (UV) stabilizers can be added to the film layer to improve the UV resistance of the metal nanowire. However, the foregoing is only to illustrate the possibility of other additional functions/names of the film layer and is not intended to limit the present disclosure.

Figure 3:
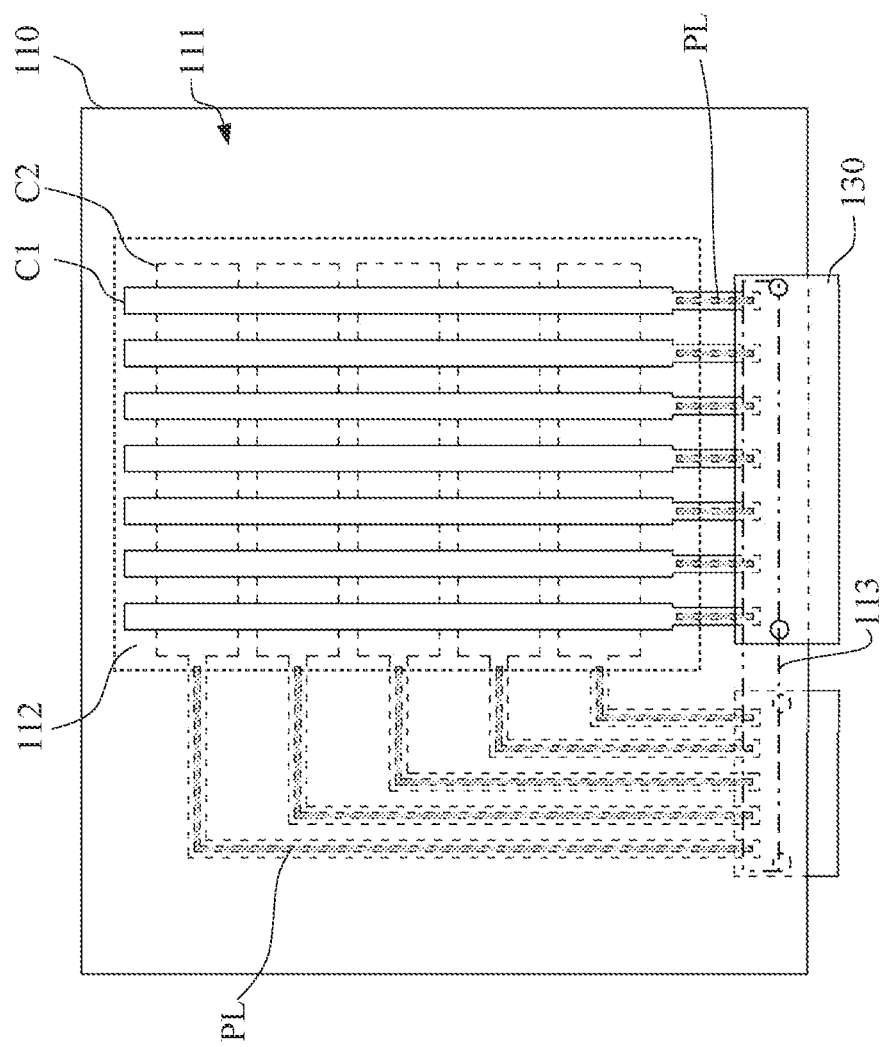
FIG. 3 is a top view of a sensing unit and a flexible circuit unit according to one embodiment of the present disclosure.

Reference is made by FIG. 2 and FIG. 3. FIG. 2 and FIG. 3 respectively illustrate top views of a sensing unit and a flexible circuit unit according to different embodiments of the present disclosure. To simplify, similar labels are used for similar units in FIGS. 2 and 3.

FIG. 2 illustrates an embodiment of a single-sided sensing unit 110 in which a plurality of sensing electrodes SC arranged parallel to each other are arranged on the sensing surface 111 of the sensing unit 110. These sensing electrodes SC are connected to the flexible circuit unit 130 through the peripheral line PL. The sensing unit 110 shown in FIG. 2 can be applied to the touch unit (such as the touch-sensing module 100) of the present disclosure. When the user touches the touch unit, the sensing electrode SC sends out the corresponding capacitance value and transmits it to the external controller (not shown) through the flexible circuit unit 130, so as to calculate the position touched by the user or gestures of the user.

FIG. 3 illustrates an embodiment of a double-sided sensing unit 110. A first sensing circuit C1 is located on the upper surface (for example, the sensing surface 111) of the sensing unit 110. The lower surface of the sensing unit 110 is opposite to the sensing surface 111. The lower surface of the sensing unit 110 is, for example, the light-receiving surface 116 (illustrated in FIG. 1). A second sensing circuit C2 is arranged on the light-receiving surface 116, which is represented by a dotted line in FIG. 3. Corresponding to the first sensing circuit C1 and the second sensing circuit C2, the upper and lower surfaces of the sensing unit 110 are provided with peripheral lines PL. Similar to the embodiment shown in FIG. 2, the ends of the peripheral lines PL extend to the connecting area 113 and are electrically connected to the flexible circuit unit 130. Further, in this embodiment, the flexible circuit unit 130 has two extension plates, which are respectively connected to the peripheral lines PL on the upper and lower surfaces of the sensing unit 110. Therefore, the peripheral lines PL on the upper surface of the sensing unit 110 are connected with one extension plate of the flexible circuit unit 130, and the peripheral lines PL on the lower surface of the sensing unit 110 are connected with the other one of the extension plates of the flexible circuit unit 130. The one extension plate of the flexible circuit unit 130 connected with the peripheral lines PL on the upper surface are arranged in the aforementioned accommodating space, so structural features of the one extension plate are similar to those described in the aforementioned embodiment. On the other hand, the other one of the extension plates of the flexible circuit unit 130 connected with the peripheral lines PL on the lower surface is not shown in the drawings. In this embodiment, the first sensing circuit C1 can be a circuit for transmitting driving signals, and the second sensing circuit C2 can be a circuit for transmitting and sensing touch signals. The first sensing circuit C1 and the second sensing circuit C2 extend alternately in the horizontal and vertical directions respectively, but the disclosure is not limited to this. In some embodiments, the first sensing circuit C1 may be a circuit for transmitting and sensing touch signals, and the second sensing circuit C2 may be a circuit for transmitting driving signals. When the user touches the touch unit, the capacitance value change between the first sensing circuit C1 and the second sensing circuit C2 can be transmitted to an external controller (not shown) through the flexible circuit unit 130, so as to calculate the touched location of the user or a gesture of the user.

In some embodiments, the first sensing circuit C1 and the second sensing circuit C2 can also be configured on one surface, such as the sensing surface 111 or the light-receiving surface 116, and the first sensing circuit C1 and the second sensing circuit C2 are insulated at the intersection of each other. This arrangement can also realize the positioning of the touched location.

Returning to FIG. 1. The optical unit 120, in this embodiment, includes a first transparent adhesive layer 121, a polarizing layer 122, and a second transparent adhesive layer 123. The first transparent adhesive layer 121 is located on the sensing surface 111. The polarizing layer 122 is located on the first transparent adhesive layer 121. The second transparent adhesive layer 123 is located on the polarizing layer 122. In this embodiment, the first transparent adhesive layer 121, the polarizing layer 122, and the second transparent adhesive layer 123 are sequentially stacked on the visible area 112 of the sensing surface 111 along the first direction d1, and the first direction d1 is parallel to the normal direction of the sensing surface 111. The polarizing layer 122 may be a stretched polarizer.

In some embodiments, the polarizing layer 122 includes a circular polarizer. The polarizing layer 122 may include a linear polarizer and a retardation film. The retardation film may include a λ/4 film, or the retardation film may have a multilayer structure including a λ/4 film and a λ/2 film.

Each of the first transparent adhesive layer 121 and the second transparent adhesive layer 123 includes optical clear adhesive (OCA). The term "adhesive layer" as used herein can include a bonding layer and an adhesion-promoting layer. The adhesive layer can be formed using a pressure sensitive adhesive (PSA) composition or an optically clear adhesive (OCA) composition. The term "transparent" used in this disclosure means the transmittance of light (such as visible light having a wavelength between 400 nm and 700 nm) >85%, >88%, >90%, >95%, etc. The transparent adhesive layers in the embodiment of the present disclosure can have proper adhesion so that the light-transmitting adhesive layer will not produce delamination, bubbles, peeling, etc. when being bent or bent in the optical stack, and the transparent adhesive layer can also have viscoelasticity for application for flexible displays. In one embodiment, the transparent adhesive layers can be formed using an acrylate composition.

Figure 4:
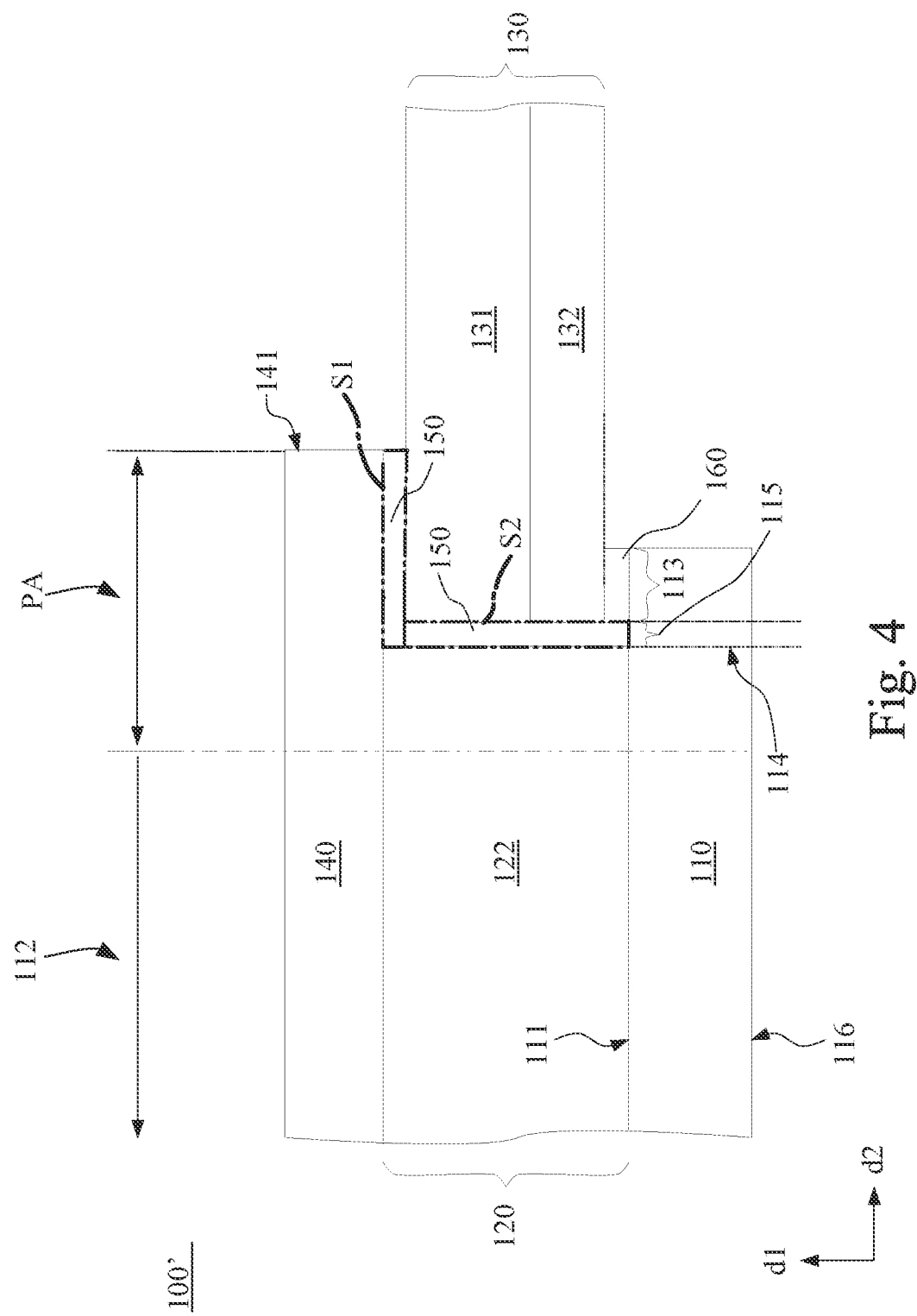
FIG. 4 is a cross-sectional view of a touch unit according to one embodiment of the present disclosure.

FIG. 4 is a cross-sectional view of a touch-sensing module 100' according to one embodiment of the present disclosure. In some embodiments, as shown in FIG. 4, the polarizing layer 122 may include a coating type polarizer. For example, the polarizing layer 122 may include a liquid crystal layer, and the polarizing layer 122 is directly coated between the transparent cover 140 and the sensing unit 110 without providing the first transparent adhesive layer 121 and the second transparent adhesive layer 123. In one embodiment, a liquid crystal composition may be coated on the surface of the transparent cover 140 to form a liquid crystal layer. In other words, the polarizing layer 122 formed by the liquid crystal layer can directly contact the transparent cover 140 and be assembled and fixed with the sensing unit 110. In some embodiments, the liquid crystal composition may include a reactive liquid crystal compound and a dichroic dye. The liquid crystal composition may further include a solvent, such as propylene glycol monomethyl ether acetate (PGMEA), xylene (Xylene)), methyl ethyl ketone (MEK), chloroform, etc.

Figure 5:
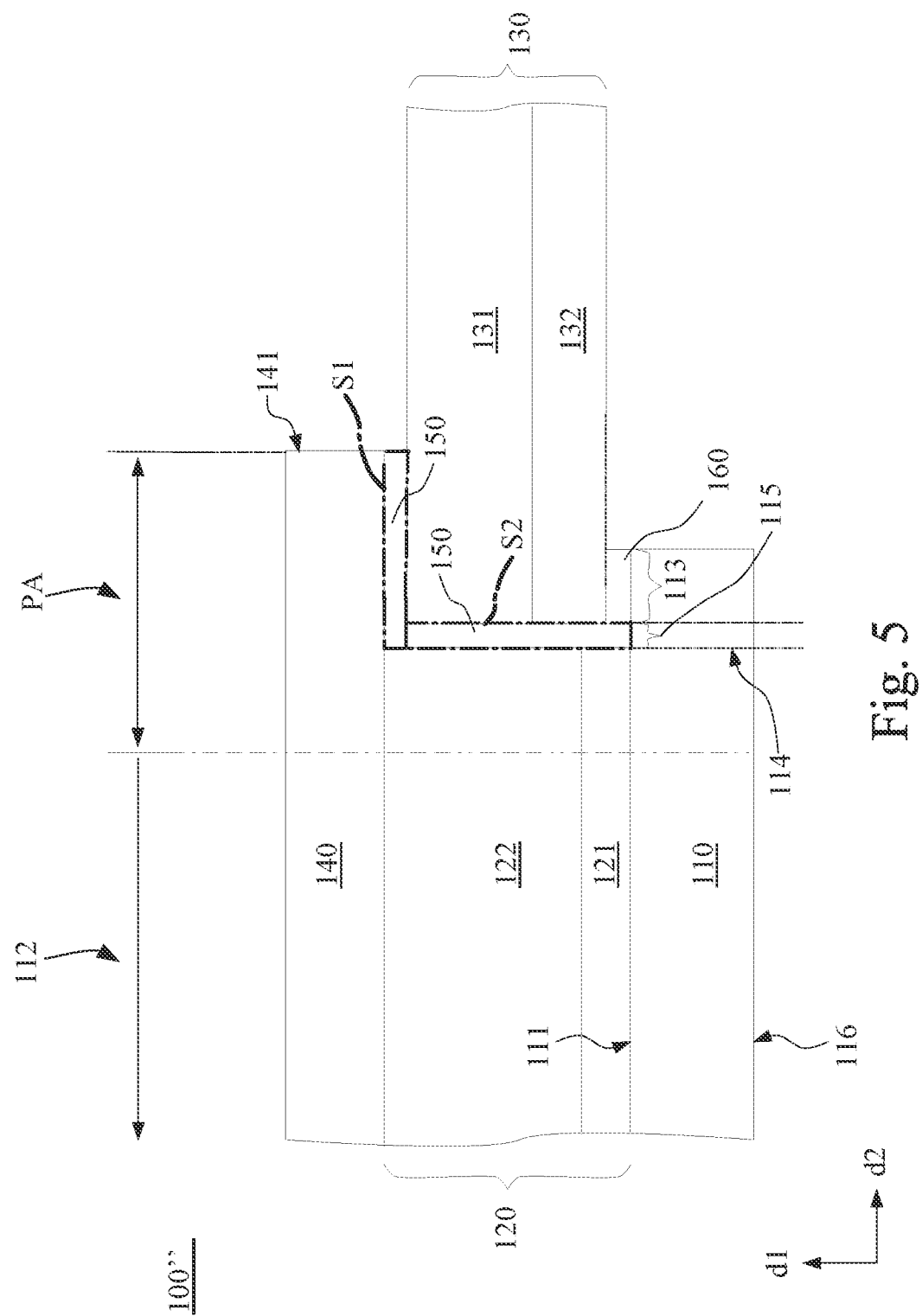
FIG. 5 is a cross-sectional view of a touch unit according to one embodiment of the present disclosure.

FIG. 5 is a cross-sectional view of a touch-sensing module 100" according to one embodiment of the present disclosure. In this embodiment, the touch-sensing module 100" uses only one transparent adhesive layer. For example, only the first transparent adhesive layer 121 is used, and the second transparent adhesive layer 123 is not used. Specifically, the aforementioned liquid crystal composition coating method can be used to directly form the polarizing layer 122 on transparent cover 140, and the sensing unit 110 is bonded or attached to the polarizing layer 122 through the first transparent adhesive layer 121.

Figure 6:
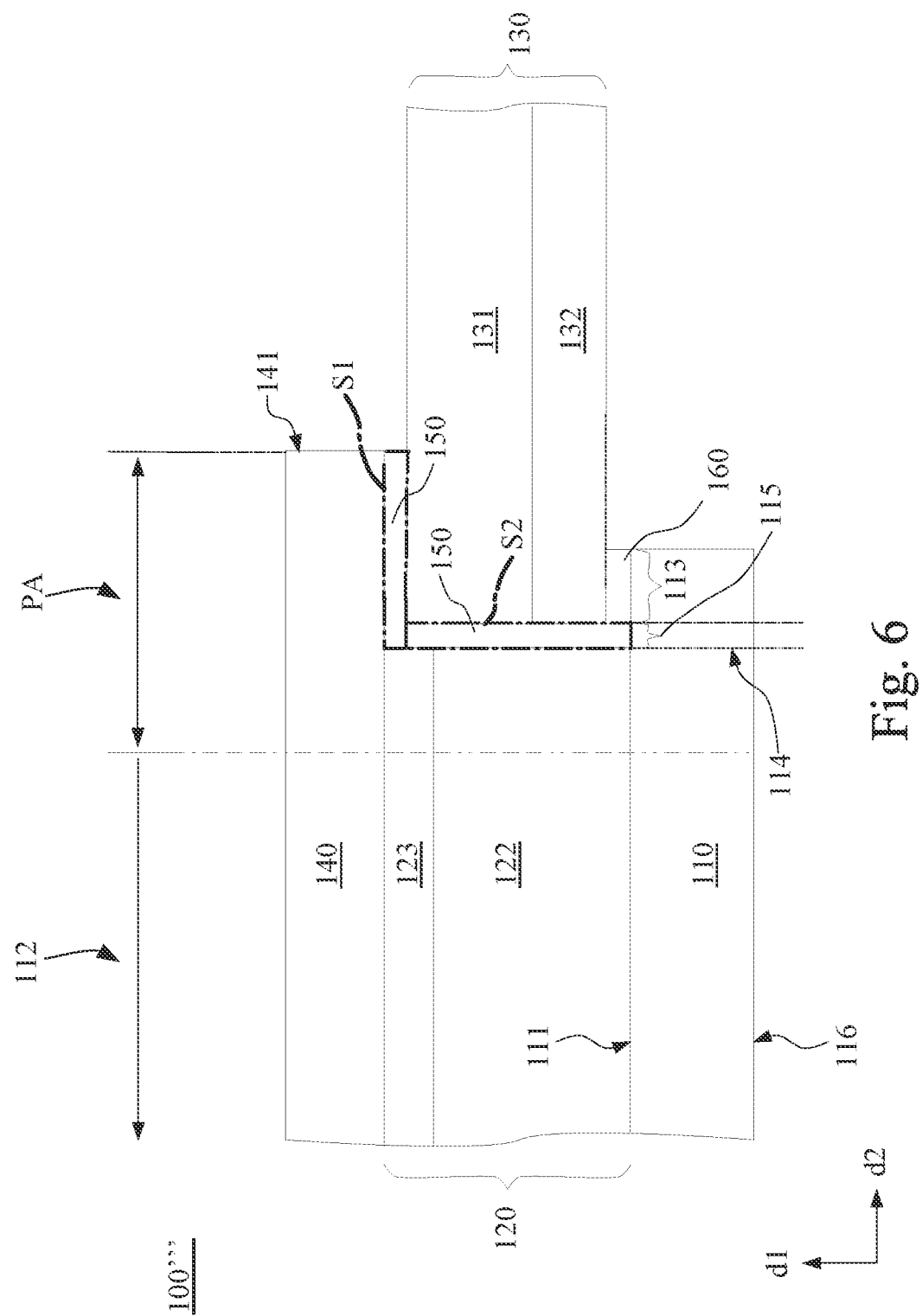
FIG. 6 is a cross-sectional view of a touch unit according to one embodiment of the present disclosure.

FIG. 6 is a cross-sectional view of a touch-sensing module 100''' according to one embodiment of the present disclosure. In this embodiment, for the touch-sensing module 100''', only the second transparent adhesive layer 123 is used, and the first transparent adhesive layer 121 is not used. Specifically, the aforementioned liquid crystal composition coating method can be used to directly form the polarizing layer 122 on the sensing unit 110, and the transparent cover 140 is bonded or attached to the polarizing layer 122 through the second transparent adhesive layer 123.

Return to FIG. 1. The flexible circuit unit 130 may include a flexible printed circuit (FPC). The touch-sensing module 100 may further include a conductive connection layer 160. The conductive connection layer 160 is located between the flexible circuit unit 130 and the connection portion of the peripheral line PL located on the connecting area 113. The conductive connection layer 160 may include an anisotropic conductive film (ACF) with a thickness h5 of about 6 μm. Furthermore, the thickness h5, the thickness h1, and the thickness of the fixing layer 150 are substantially the same as the thickness of the accommodating space.

Furthermore, in some embodiments, the flexible circuit unit 130 may include a base layer 131 and a first metal layer 132.

In this embodiment, the thickness h1 of the flexible circuit unit 130 in the first direction d1 ranges from 30 μm to 43 μm. For example, in this embodiment, a thickness h2 of the base layer 131 is 25 μm, and a thickness h3 of the first metal layer 132 is 12 μm. In some embodiments, the thickness h1 of the flexible circuit unit 130 is about 42.5 μm. In some embodiments, the thickness of the optical unit 120 is about 53.8 μm (also equivalent to the thickness h4 of the accommodating space in the first direction d1). In some embodiment, the thickness of the flexible circuit unit 130 and the thickness h5 of the conductive connection layer 160 do not exceed the thickness of the optical unit 120, and the flexible circuit unit 130 does not affect the configuration of the transparent cover 140. In this embodiment, the thickness h1 of the flexible circuit unit 130 occupies about 79% of the thickness h4 of the accommodating space in the first direction d1.

Furthermore, in this embodiment, the first metal layer 132 may include copper, and the first metal layer 132 is formed on the base layer 131 by a hole plating process, or the first metal layer 132 may further include an electroplating layer. Therefore, the thickness h1 of the flexible circuit unit 130 can be in a range of 30 μm to 45 μm, but the present disclosure is not limited thereto. Through calculation, the thickness h1 is equivalent to about 55% to 83% of the thickness h4 (based on 53.8 μm) of the accommodating space in the first direction d1. In other embodiments, the thickness h1 of the flexible circuit unit 130 can also be about 10 μm to 15 μm (for example, about 12.5 μm), so as to provide a thinner flexible circuit unit 130. Through calculation, the thickness h1 is equivalent to about 23% of the thickness h4 (based on 53.8 μm) of the accommodating space in the first direction d1. In other embodiments, the thickness h1 of the flexible circuit unit 130 may be about 12.5 μm, so as to provide a thinner flexible circuit unit 130 and cooperate with a thinner optical unit 120. For example, the optical unit 120 shown in FIG. 6 has a thickness h4 of about 28.8 μm. Through calculation, the thickness h1 of the flexible circuit unit 130 is equivalent to 45% of the thickness h4 (with 28.8 μm as the calculation basis) in the first direction d1. That is, the flexible circuit unit 130 occupies about 45% of the accommodating space. In other embodiments, the thickness h2 of the base layer 131 of the flexible circuit unit 130 may be about 12.5 μm, so as to provide a thinner flexible circuit unit 130 to match the thinner optical unit 120 in consideration with the thickness h5 of the conductive connection layer 160 (approximately 6 μm). For example, as shown in FIG. 6, the optical unit 120 has a thickness h4 of approximately 28.8 μm. Through calculation, the thickness h1 of the flexible circuit unit 130 is equivalent to 55% of the thickness h4 (calculated based on 28.8 μm) of the accommodating space in the first direction d1, the thickness of the conductive connection layer 160 is equivalent to approximately 21% of the thickness h4 (based on the calculation basis of 28.8 μm) of the accommodating space in the first direction d1, and the thickness h6 of the fixing layer 150 is equivalent to approximately 24% of the thickness h4 (calculated based on 28.8 μm) of the accommodating space in the first direction d1.

The accommodating space defined by the transparent cover 140, the optical unit 120, and the sensing unit 110 has the thickness h4 in the first direction d1. The flexible circuit unit 130 has the thickness h1 in the first direction d1, and the optical unit 120 has the thickness h4 in the first direction d1. The thickness h4 is greater than the thickness h1, and the thickness h1 is selected to be in a range of 50% to 80% of the thickness h4, so that the flexible circuit unit 130 is strong enough for the subsequent hot pressing process, namely a process in which the sensing unit 110 and soldering pads of the flexible circuit unit 130 are processed by thermoscompression welding. Therefore, after assembly, the flexible circuit unit 130 will not structurally interfere with the transparent cover 140 on the optical unit 120, and the flexible circuit unit 130 can meet the mechanical structure requirements of the subsequent manufacturing process.

Furthermore, as shown in FIG. 1, the connecting space S1 has a thickness h6, which corresponds to the thickness h4 of the accommodating space defined by the transparent cover 140, the optical unit 120, and the sensing unit 110 in the first direction d1 minus the thickness h1 of the flexible circuit unit 130 in the first direction d1 and minus the thickness h5 of the conductive connection layer 160 in the first direction d1. In this embodiment, the fixing layer 150 provided in the connecting space S1 also has a thickness h6 in the first direction d1. Due to the thinned flexible circuit unit 130, the thickness h6 of the fixing layer 150 in the connecting space S1 in the first direction d1 ranges from 10% to 40% of the thickness h4 of the accommodating space in the first direction d1. When the thickness h6 of the fixing layer 150 is less than 10% of the thickness h4 of the accommodating space, the fixing layer 150 may not be able to effectively fix the flexible circuit unit 130, causing product reliability problems. When the thickness h6 is greater than 40% of the thickness h4 of the accommodating space, the flexible circuit unit 130 to be too thin to perform the hot pressing process. In addition, the thickness h5 of the conductive connection layer 160 accounts for about a range of 10% to 25% of the thickness h4 of the accommodating space in the first direction d1. Therefore, the present disclosure can mainly avoid the unintended bump problem caused by the structural interference between the flexible circuit unit 130 and the transparent cover 140, and the present disclosure also proposes a good solution in view of the product structure strength and process requirements.

In the embodiments of the present disclosure, the touch-sensing module 100 can be assembled with other electronic units to form a device/product, such as a display with touch function. Reference is made by FIG. 7. For example, the sensing unit 110 can be attached to a display unit 210. For example, when the display unit is a liquid crystal display unit or an organic light emitting diode (OLED) display unit, optical glue or other similar adhesives can be used for bonding between the sensing unit and the display unit. The touch-sensing module 100 of the embodiments of the present disclosure can be applied to electronic devices such as portable phones, tablet computers, notebook computers, etc. and can also be applied to flexible products. The touch-sensing module 100 of the embodiments of the present disclosure can also be manufactured in wearable devices (such as watches, glasses, smart clothes, smart shoes, etc.) or on automotive devices (such as dashboards, driving recorders, car rearview mirrors, car windows, etc.).

Figure 7:
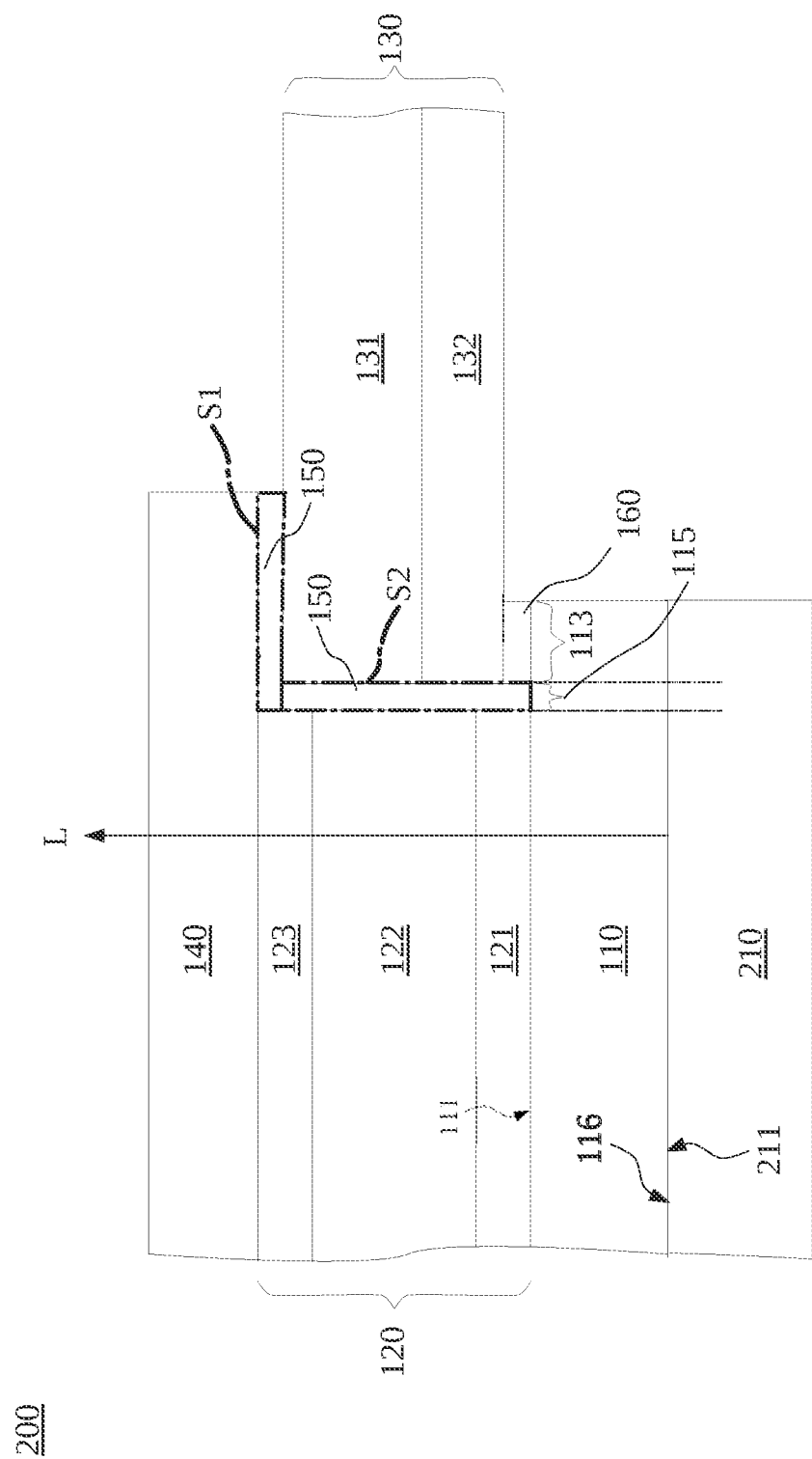
FIG. 7 is a cross-sectional view of a touch display module according to one embodiment of the present disclosure.

Reference is made by FIG. 7. FIG. 7 is a cross-sectional view of the touch display device according to one embodiment of the present disclosure. The touch display module 200 includes the display unit 210, the sensing unit 110, the optical unit 120, the flexible circuit unit 130, the transparent cover 140, and the fixing layer 150. The configuration of the sensing unit 110, the optical unit 120, the flexible circuit unit 130, the transparent cover 140, and the fixing layer 150 is similar to the above-mentioned touch-sensing module 100, and details of the configuration are not repeated here. The display unit 210 has a display surface 211, and the sensing unit 110 is located on the display surface 211, so the light-receiving surface 116 of the sensing unit 110 can receive image light L so that the image light L is transmitted from the sensing surface 111.

In summary, since the touch unit and the touch display module of the embodiment of the present disclosure includes a flexible circuit unit and a transparent cover, and a connecting space is formed between the flexible circuit unit and the transparent cover for configuration of a fixing layer, the flatness of the transparent cover will not be affected by the flexible circuit units and the overall stability can be further increased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A touch-sensing module, comprising:
   a sensing unit, wherein the sensing unit has a sensing surface, and a normal direction of the sensing surface is parallel to a first direction;
   an optical unit disposed on the sensing unit;
   a transparent cover disposed on the optical unit, wherein the transparent cover, the optical unit, and the sensing unit define an accommodating space; and
   a flexible circuit unit disposed in the accommodating space, wherein a connecting space is defined between the transparent cover and the flexible circuit unit, a fixing layer is disposed in the connecting space to connect the transparent cover and the flexible circuit unit, and a thickness of the flexible circuit unit in the first direction ranges from 50% to 80% of a thickness of the accommodating space in the first direction.

2. The touch-sensing module of claim 1, wherein a thickness of the fixing layer in the first direction ranges from 10% to 40% of the thickness of the accommodating space in the first direction.

3. The touch-sensing module of claim 1, further comprising a visible area and a peripheral area, wherein the sensing unit defines a connecting area in the peripheral area over which the flexible circuit unit is disposed, and a filling area comprising glue is disposed between the flexible circuit unit and the sensing unit.

4. The touch-sensing module of claim 3, wherein the optical unit comprises:
   a first transparent adhesive layer disposed on the sensing surface of the sensing unit in the visible area;
   a polarizing layer disposed on the first transparent adhesive layer; and
   a second transparent adhesive layer disposed on the polarizing layer.

5. The touch-sensing module of claim 3, further comprising a conductive connection layer, wherein the conductive connection layer is disposed between the flexible circuit unit and the connecting area of the sensing unit, and a thickness of the conductive connection layer ranges from 10% to 25% of the thickness of the accommodating space.

6. The touch-sensing module of claim 1, wherein the thickness of the flexible circuit unit in the first direction ranges from 30 µm to 43 µm, or the thickness of the flexible circuit unit in the first direction ranges from 10 µm to 15 µm.

7. A touch-sensing module, comprising:
   a sensing unit;
   an optical unit disposed on the sensing unit; and
   a flexible circuit unit connected to the sensing unit, wherein a thickness of the flexible circuit unit along a first direction is less than a thickness of the optical unit along the first direction, a bottom surface of the flexible circuit unit is offset in the first direction from a bottom surface of the optical unit, the sensing unit has a sensing surface, a normal direction of the sensing surface is parallel to the first direction, and the thickness of the flexible circuit unit in the first direction ranges from 50% to 80% of a thickness of an accommodating space defined in part by the optical unit in the first direction.

8. The touch-sensing module of claim 7, comprising a visible area and a peripheral area, wherein the sensing unit defines a connecting area in the peripheral area over which the flexible circuit unit is disposed, and a filling area comprising glue is disposed between the flexible circuit unit and the sensing unit.

9. The touch-sensing module of claim 8, wherein the optical unit comprises:
   a first transparent adhesive layer disposed on the sensing surface of the sensing unit in the visible area;
   a polarizing layer disposed on the first transparent adhesive layer; and
   a second transparent adhesive layer disposed on the polarizing layer.

10. The touch-sensing module of claim 8, further comprising a conductive connection layer, wherein the conductive connection layer is disposed between the flexible circuit unit and the connecting area of the sensing unit, a bottom surface of the conductive connection layer aligns with the bottom surface of the optical unit, a top surface of the conductive connection layer connects with the bottom surface of the flexible circuit unit, and a thickness from the bottom surface of the conductive connection layer to the top surface of the conductive connection layer ranges from 10% to 25% of a thickness of the accommodating space.

11. The touch-sensing module of claim 7, wherein the thickness of the flexible circuit unit in the first direction ranges from 30 µm to 43 µm, or the thickness of the flexible circuit unit in the first direction ranges from 10 µm to 15 µm.

12. A device comprising the touch-sensing module of claim 1.

13. The touch-sensing module of claim 1, wherein a sidewall of the fixing layer is co-planar with a sidewall of the transparent cover.

14. A touch-sensing module, comprising:
   a sensing unit;
   an optical unit disposed on the sensing unit; and
   a flexible circuit unit connected to the sensing unit, wherein a thickness of the flexible circuit unit along a first direction is less than a thickness of the optical unit along the first direction, a bottom surface of the flexible circuit unit is offset in the first direction from a bottom surface of the optical unit, the sensing unit has a sensing surface, a normal direction of the sensing surface is parallel to the first direction, and the thickness of the flexible circuit unit in the first direction ranges from 10% to 40% of a thickness of an accommodating space defined in part by the optical unit in the first direction.

15. The touch-sensing module of claim 14, comprising a visible area and a peripheral area, wherein the sensing unit defines a connecting area in the peripheral area over which the flexible circuit unit is disposed, and a filling area comprising glue is disposed between the flexible circuit unit and the sensing unit.

16. The touch-sensing module of claim 15, wherein the optical unit comprises:
   a first transparent adhesive layer disposed on the sensing surface of the sensing unit in the visible area;
   a polarizing layer disposed on the first transparent adhesive layer; and
   a second transparent adhesive layer disposed on the polarizing layer.

17. The touch-sensing module of claim 15, further comprising a conductive connection layer, wherein the conductive connection layer is disposed between the flexible circuit unit and the connecting area of the sensing unit, a bottom surface of the conductive connection layer aligns with the bottom surface of the optical unit, a top surface of the conductive connection layer connects with the bottom surface of the flexible circuit unit, and a thickness from the bottom surface of the conductive connection layer to the top surface of the conductive connection layer ranges from 10% to 25% of a thickness of the accommodating space.

18. The touch-sensing module of claim 14, wherein the thickness of the flexible circuit unit in the first direction ranges from 30 µm to 43 µm, or the thickness of the flexible circuit unit in the first direction ranges from 10 µm to 15 µm.

* * * * *